Dec. 21, 1965 W. J. RICHARDS 3,225,304

CONSTANT OUTPUT AMPLIFIER INCLUDING LIGHT RESPONSIVE FEEDBACK MEANS

Filed Aug. 22, 1963 2 Sheets-Sheet 1

INVENTOR.
WILLIAM J. RICHARDS
BY H. M. Saragovitz,
E. J. Kelly & H. Berl

INVENTOR.
WILLIAM J. RICHARDS
BY H. M. Saragovitz, E. J. Kelly & H. Berl

United States Patent Office 3,225,304
Patented Dec. 21, 1965

3,225,304
CONSTANT OUTPUT AMPLIFIER INCLUDING LIGHT RESPONSIVE FEEDBACK MEANS

William J. Richards, 1315 Montana, El Paso, Tex.
Filed Aug. 22, 1963, Ser. No. 303,970
2 Claims. (Cl. 330—28)
(Granted under Title 35, U.S. Code (1952), sec. 266)

The invention described herein may be manufactured and used by or for the Government for governmental purposes, without the payment to me of any royalty thereon.

This invention relates to signal amplifier systems and more particularly to signal amplifier systems which employ means for achieving constant output level from amplifiers.

In the conventional automatic gain control circuit for achieving constant output level from amplifiers, the gain of the amplifier is reduced by the excess of output level over the desired output level. In the instant invention the gain of the amplifier remains constant, but the negative signal feedback is used to reduce the gain of the system, the degree of feedback being a function of the output level.

An object of the invention is a constant output amplifier wherein a variable resistor is included in a negative feedback loop, the resistance value of which is a function of the average output level.

Another object of the invention is a constant output amplifier wherein is included in the negative feedback loop, a feedback element comprising a solid state, light sensitive resistor and a light source driven by a control amplifier.

A better understanding of the invention may be had by referring to the following description of the invention taken in conjunction with the accompanying drawings, in which.

Figure 1:
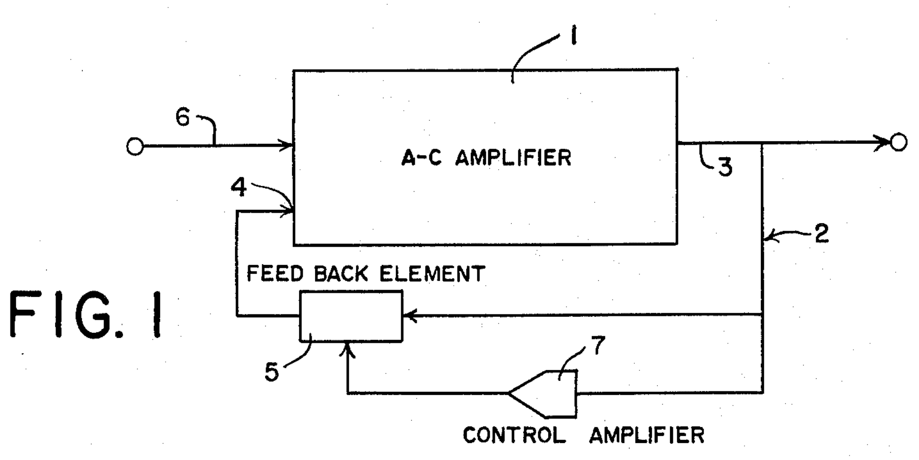
FIGURE 1 is a block diagram illustrating one embodiment of the invention.

Referring now to FIGURE 1, the A.-C. amplifier 1 is provided with a signal current feedback circuit 2 from the output 3 to the input 4 of the amplifier through a feedback element 5. Reference numeral 6 indicates the signal input to the amplifier. Specifically the feedback element 5 consists of a solid state, light sensitive resistor such as a cadmium sulfide photo-resistor and a light source driven by a control amplifier 7 which is coupled to the output 3 of amplifier 1. This method of control differs from previous methods such as wherein vacuum tubes are utilized which may be controlled by applying a voltage proportional to the average output signal to the suppression grid of a previous stage. Tetrode transistors can be arranged circuit wise to control amplifier gain by applying bias across the base terminals. However, such transistor circuits are few, the range of control is limited and distortion increases as the input signal increases in magnitude. In the method of the invention only simple, cheap and readily available components are used and the nature of the circuit insures low distortion over the entire control range. As the input to the amplifier increases, the negative feedback increases to keep the amplifier output constant and thereby provide increasing correction for large signal non-linearities in the input stage of the amplifier.

Figure 2:
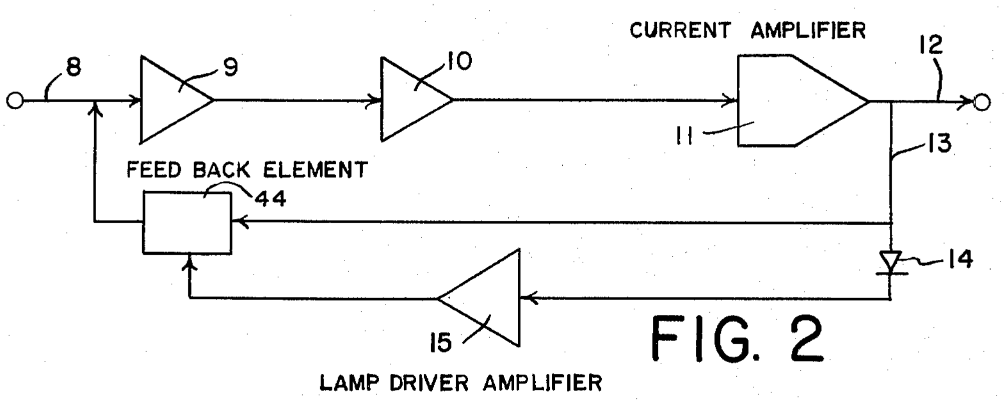
FIGURE 2 is a block diagram of a typical two stage amplifier showing the control loop of the invention.

FIGURE 2 illustrates another embodiment of the invention wherein a typical two stage amplifier is provided with the single loop negative feedback means of the invention. Reference numeral 8 indicates the signal input to the first stage 9 which is coupled to a second stage 10 coupled to current amplifier 11, the output 12 of which may be coupled to a utilization device. The feedback loop 13 connects the output of current amplifier 11 through the feedback element 44 to the input of the first stage 9. The output of current amplifier 11 is also applied to a rectifier 14 which powers the lamp driver amplifier 15, thereby controlling the intensity of the light source contained in the feedback element 44. In a practical circuit the feedback loop will be from the output plate (or collector) to the input cathode (or emitter) of the amplifier where the terms in parenthesis represent the elements of a transistor grounded emitter stage. Since the input impedance for the transistor versions is low the feedback loop is better controlled by adding a low-impedance, signal following stage (current amplifier 11) to the output of the two stage amplifier. In general this is useful for the signal output to following equipment and also provides matching means between the amplifier output and the lamp driver amplifier since the latter must drive a low impedance if the light source in the feedback element is a tungsten filament bulb. The lamp driver amplifier is a D.C. amplifier in order that the rise and fall characteristics of the amplifier gain may be controllable and slow enough to allow the A.C. amplifier to pass very low frequencies without oscillating.

Figure 3:
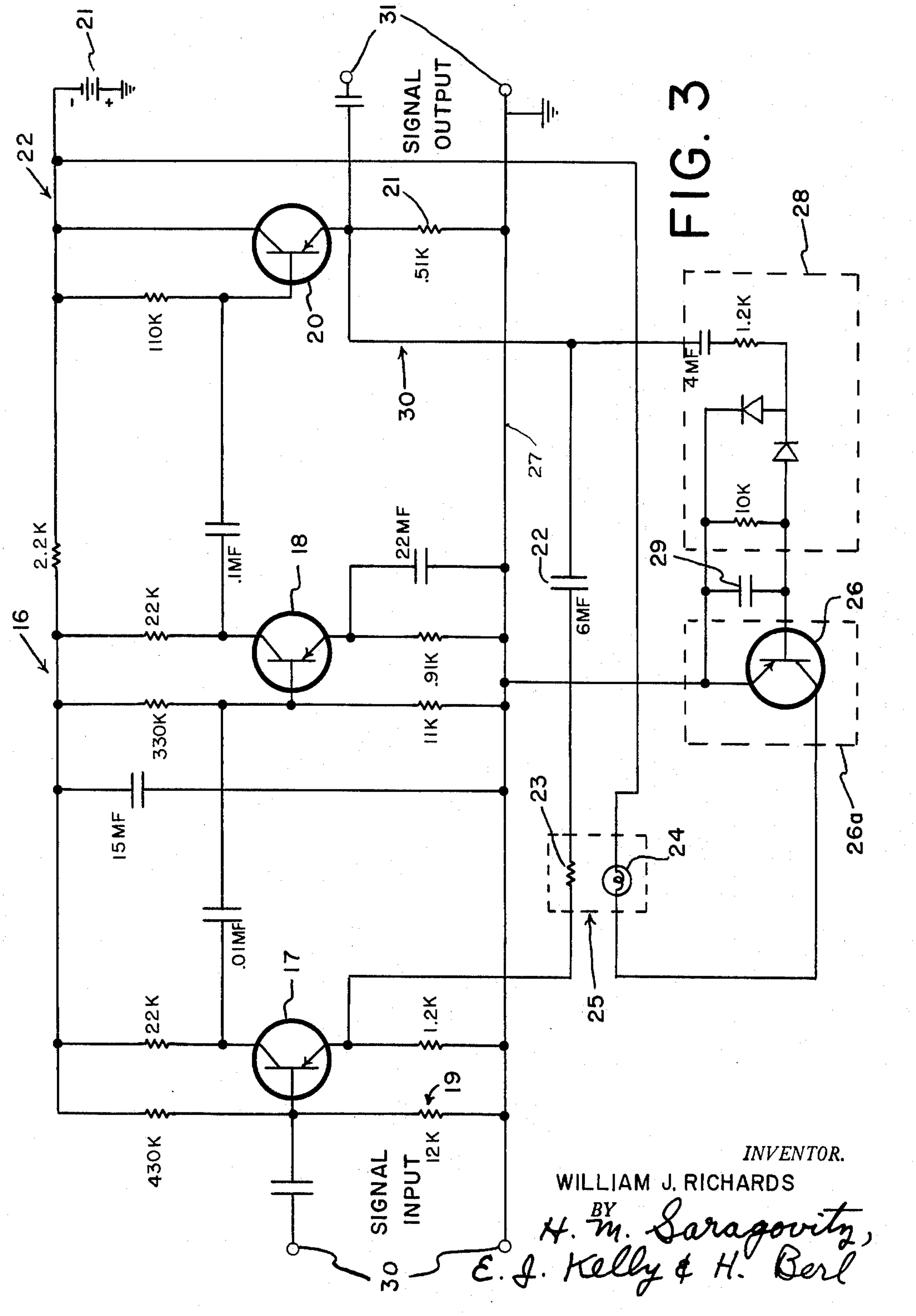
FIGURE 3 is a circuit diagram of a transistor amplifier employing the feedback system of the invention.

In FIGURE 3 there is shown a complete practical circuit of one embodiment of the present invention wherein the constant output amplifier comprises a two stage common-emitter amplifier 16 consisting of a first stage transistor 19, 2N1303, common-emitter amplifier, a second stage transistor 18, 2*N*1303, common-emitter amplifier and a transistor 20, 2N1303, emitter-follower output stage 22, 2N353. The signal input is applied across the base and emitter elements of transistor 17 through terminals 30 and the signal output is taken across the emitter resistor 21 of the transistor 20 through terminals 31. A battery 21 supplies the power for operating the amplifier. Thus far the amplifier is a well known transistor amplifier including the usual standard biasing and coupling means. The feedback element 25 consists of four type "49" tungsten lamps 24 in series which are faced into a cadmium sulfied photo-resistor 23. The negative feedback loop 30 is obtained by coupling the emitter of transistor 20 through the series connected capacitor 22 and photo-resistor 23 to the emitter of transistor 17. The four series connected lamps 24 have one terminal connected to minus (—) pole of battery 21 and the other terminal connected to the collector of the transistor 26, 2N353, of the lamp driver amplifier 26*a*. The emitter of transistor 26 is returned to common circuit 27. The transistor 26 is powered by the signal output voltage developed across resistor 21 through means of a voltage multiplier-rectifier 28 which has its input connected across resistor 21. The output signal voltage is rectified by two diodes of voltage multiplier-rectifier 28 with the positive and negative components of the resultant D.-C. voltage applied to the emitter and base, respectively, of the transistor 26. Control response time is obtained through capacitor 29 which is connected across the base and emitter of transistor 26. The fastest control response is obtained when capacitor 29 is removed from across the transistor 26. When slow response times are desired, the capacitor 29 may be increased to several hundred microfarads. A practical way to obtain very long response time would be to substitute a two stage transistor amplifier with high input impedance shunted with a large capacitor for the single stage lamp driver amplifier 26*a*.

In operation, the signal feedback voltage is taken from the emitter of transistor 20 of the output stage 22 and fed through capacitor 22 and photo-resistor 23 and then applied to the emitter of transistor 17 of the first stage amplifier. The resistance variations of photo-resistor 23 being controlled by the degree of illumination of lamps 24 in response to the average value of voltage of the output stage which is also obtained from the emitter of transistor 20, rectified by the voltage multiplier-rectifier and applied to the lamps 24 through the lamp driver amplifier 26*a*. The linearity of the light source intensity versus the resistance of the photo-resistor is not critical since the lamp driver amplifier is also in the negative feedback loop and the circuit is self-adjusting.

Figure 4:
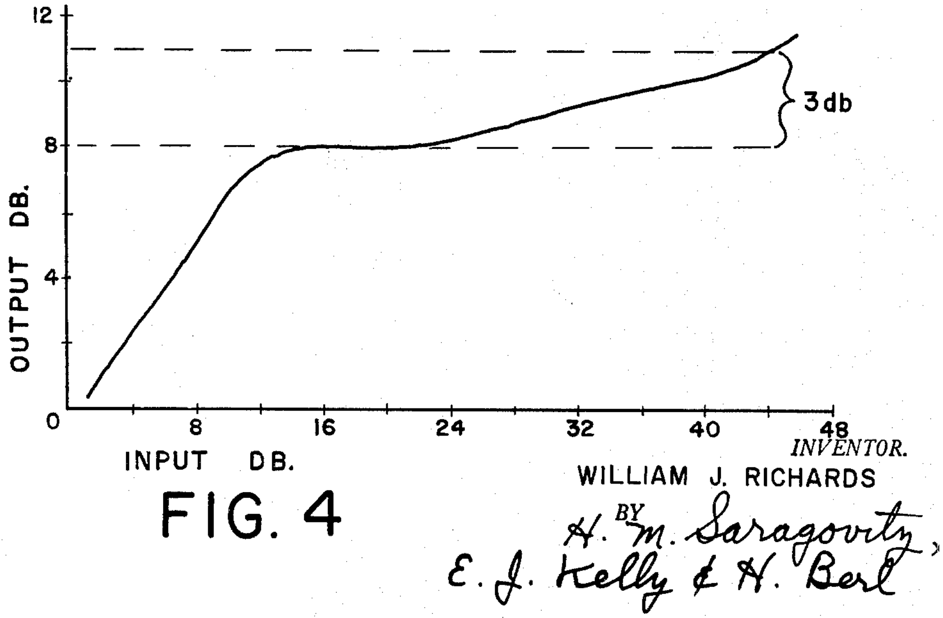
FIGURE 4 is a graph showing the characteristics of the amplifier of FIGURE 3.

FIGURE 4 shows the control characteristics of the constant output amplifier of the invention. The output varies to about three decibels for input voltage varying from 3 millivolts to 200 millivolts. With the reference to FIGURE 3, the frequency response was intentionally cut off below 100 cycles. Frequency response to 20 cycles may be obtained by increasing the input and interstage capacitors to approximately 1 mfd. The upper frequency limit in this case is about 25 kc. for a two db change over the 1 kc. response.

While I have shown and described various forms of my invention, it will be apparent to those skilled in the art that modifications may be made therein without departing from the scope of my invention. Consequently, I do not wish to be restricted to the particular form or arrangement herein described and shown except as limited by my claims.

I claim as my invention:

1. A constant output amplifier comprising a first stage and a second stage common-emitter amplifier coupled to an emitter-follower stage, a potential source for said amplifier, the transistor of each stage having base, collector and emitter electrodes the negative pole of said potential source connected to the collector electrode and base electrode of the transistor of each of said stages and the positive pole connected to the emitter electrode of the transistor of each of said stages, the signal input applied across the base and emitter of said first stage and output signal taken at the emitter of the emitter-follower, a negative feedback loop including a series connected capacitor and feedback element coupling the emitter of said emitter-follower to the emitter of the first stage of the common-emitter amplifier, the feedback element comprising a light sensitive resistor having series connected tungsten lamps faced in its surface, a voltage multiplier-rectifier, a D.-C. amplifier, the input of said rectifier coupled to the emitter of the emitter-follower and its output applied across the base and emitter electrodes of the D.-C. amplifier the emitter electrode of the D.-C. amplifier being connected to the positive pole of said potential source, the series connected lamps having one terminal connected to the negative pole of said potential source and the other terminal connected to the collector of the D.-C. amplifier, the resistance of the light sensitive resistor varying in response to the illumination intensity of the lamps whereby the degree of negative feedback is controlled in proportion to the signal output level of the amplifier and control response time means for the D.-C. amplifier.

2. The invention in accordance with claim 1 wherein said control response time means comprises a capacitor connected across the base and emitter electrodes of the D.-C. amplifier.

References Cited by the Examiner

UNITED STATES PATENTS

| | | | |
|---|---|---|---|
| 3,003,096 | 10/1961 | Du Bois. | |
| 3,082,381 | 3/1963 | Morrill et al. | 330—59 |
| 3,087,120 | 4/1963 | Schoellhorn et al. | 330—59 |
| 3,167,722 | 1/1965 | Weller | 330—59 |
| 3,185,936 | 5/1965 | Fuller | 330—59 |

FOREIGN PATENTS

| | | |
|---|---|---|
| 904,031 | 8/1962 | Great Britain. |

ROY LAKE, *Primary Examiner.*

F. D. PARIS, *Assistant Examiner.*